(12) United States Patent
Ho et al.

(10) Patent No.: US 6,657,296 B2
(45) Date of Patent: Dec. 2, 2003

(54) SEMICONDCTOR PACKAGE

(75) Inventors: Tzong-Da Ho, Taichung (TW); Chien-Ping Huang, Hsinchu Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/962,596

(22) Filed: Sep. 25, 2001

(65) Prior Publication Data

US 2003/0057534 A1 Mar. 27, 2003

(51) Int. Cl.⁷ .............................................. H01L 23/34
(52) U.S. Cl. ..................... 257/720; 257/706; 257/780; 257/779; 257/787
(58) Field of Search ................................ 257/720, 706, 257/779–780, 787, 719, 708, 707, 784

(56) References Cited

U.S. PATENT DOCUMENTS

| | | | |
|---|---|---|---|
| 3,593,064 A | * 7/1971 | Wagner | 317/100 |
| 5,216,278 A | 6/1993 | Lin et al. | 257/688 |
| 5,642,261 A | 6/1997 | Bond et al. | 361/704 |
| 5,856,911 A | * 1/1999 | Riley | 361/704 |
| 5,942,795 A | * 8/1999 | Hoang | 257/692 |
| 6,249,053 B1 | * 6/2001 | Nakata et al. | 257/738 |
| 6,265,772 B1 | * 7/2001 | Yoshida | 257/712 |
| 6,359,341 B1 | * 3/2002 | Huang et al. | 257/778 |

\* cited by examiner

*Primary Examiner*—Kamand Cuneo
*Assistant Examiner*—Luan Thai
(74) *Attorney, Agent, or Firm*—Peter F. Corless; Steven M. Jensen; Edwards & Angell, LLP

(57) ABSTRACT

A semiconductor package is proposed, in which at least one chip is mounted on a substrate, and at least one die-attach region is formed on the substrate. A plurality of thermal vias formed in the die-attach region and penetrating the substrate, in a manner that the thermal vias each has a top end connected to the chip mounted on the substrate and a bottom end connected to a thermal pad formed beneath the substrate at a position corresponding to the die-attach region. The thermal pad has a surface directly exposed to the atmosphere, allowing heat generated by the chip to be dissipated through the thermal vias and the exposed surface of the thermal pad to the atmosphere, so as to significantly improve heat dissipating efficiency for the semiconductor package.

11 Claims, 3 Drawing Sheets

A BGA (ball grid array) semiconductor package employs a large quantity of solder balls acting as I/O connections in the interest to incorporate a chip of high integration. However, much heat is generated in operation of such a high integration chip. Therefore, how to effectively dissipate the generated heat is definitely a problem to solve.

In order to solve the heat dissipation problem, U.S. Pat. No. 5,216,278 proposes a BGA semiconductor package, in which a plurality of thermal balls are implanted on a bottom side of a substrate, so as to allow heat generated by a chip mounted on a top side opposing the bottom side of the substrate to be transmitted to a printed circuit board (PCB) connected to the semiconductor package. Accordingly, heat dissipating efficiency can be improved in such a semiconductor package. However, as the thermal balls implanted on the substrate are limited in quantity according to area on the substrate available for thermal ball implantation, the improvement in the heat dissipating efficiency is thus restricted.

Therefore, U.S. Pat. No. 5,642,261 discloses a semiconductor package having a heat sink mounted on a substrate, wherein the heat sink has a larger heat dissipating area so as to help eliminate the restriction on the improvement in the heat dissipating efficiency in the U.S. Pat. No. 5,216,278. As shown in FIG. 6, in the semiconductor package, the substrate 10 is formed with an opening 100 penetrating the substrate 10, and the heat sink 11 is disposed in the opening 100 in a manner as to come into contact with a chip 12, for allowing heat generated by the chip 12 to be directly dissipated through the heat sink 11 to the atmosphere. However, the formation of the opening 100 in the substrate 10 increases the cost; whereas due to the significant difference in coefficient of thermal expansion between the substrate 10 and the heat sink 11, thermal stress produced during a temperature cycle and a reliability test causes cracks at an interface between the substrate 10 and the heat sink 11. This allows external moisture to penetrate into the internal of the semiconductor package through the cracks, and thus reliability of the semiconductor package is undesirably affected.

SUMMARY OF THE INVENTION

A primary objective of the present invention is to provide a semiconductor package, which allows heat generated by a chip to be directly dissipated through a heat sink to the atmosphere without forming an opening on a substrate for attaching the heat sink to the substrate, so that the increase in fabrication cost can be eliminated and the heat sink can provide sufficient heat dissipating area for effectively dissipating the heat generated by the chip.

In accordance with the foregoing and other objectives, the present invention proposes a semiconductor package, comprising: a substrate having a top side and an opposing bottom side, wherein on the top side there is predefined a die-attach region formed with a plurality of thermal vias therewithin, and on the bottom side there is formed a thermal pad connecting to the thermal vias at a position corresponding to the die-attach region; at least one chip mounted on the die-attach region of the substrate and electrically connected to the substrate; a plurality of conductive elements electrically connected to the bottom side of the substrate for electrically connecting the chip to an external device; and an encapsulant formed on the top side of the substrate for encapsulating the chip.

In order to allow the conductive elements to be electrically connected to the external device properly, the thermal pad has a thickness to be necessarily smaller than the height of the conductive elements. Moreover, the thermal pad is attached to the substrate in a manner that edge sides of the thermal pad are encapsulated by solder mask covering the bottom side of the substrate, and a surface of the thermal pad not encapsulated by the solder mask is exposed to the atmosphere.

BRIEF DESCRIPTION OF THE DRAWINGS

The present invention can be more fully understood by reading the following detailed description of the preferred embodiments, with reference made to the accompanying drawings wherein.

DETAILED DESCRIPTION OF THE PREFERRED EMBODIMENT

First Preferred Embodiment

Figure 1:
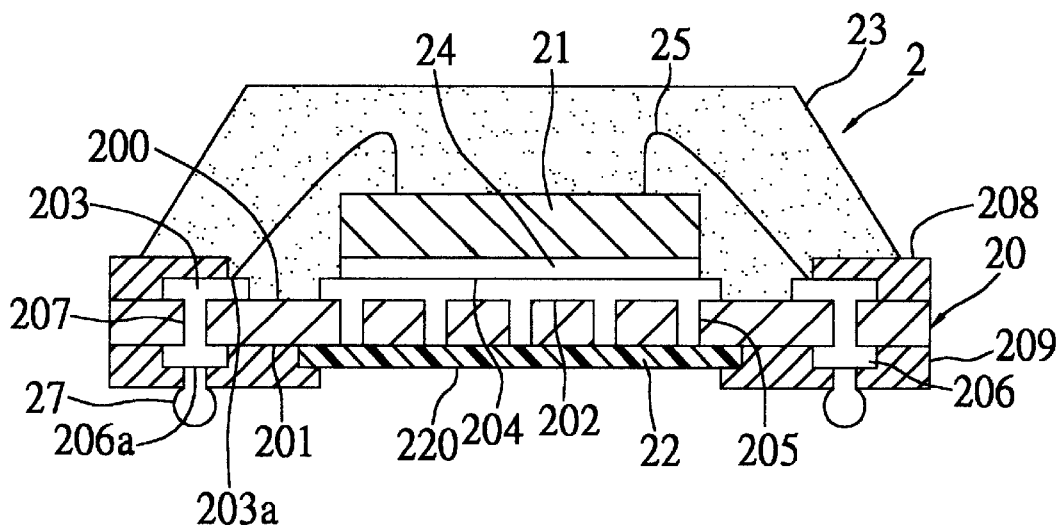
FIG. 1 is a sectional view of a first preferred embodiment of the semiconductor package of the invention.
Figure 2:
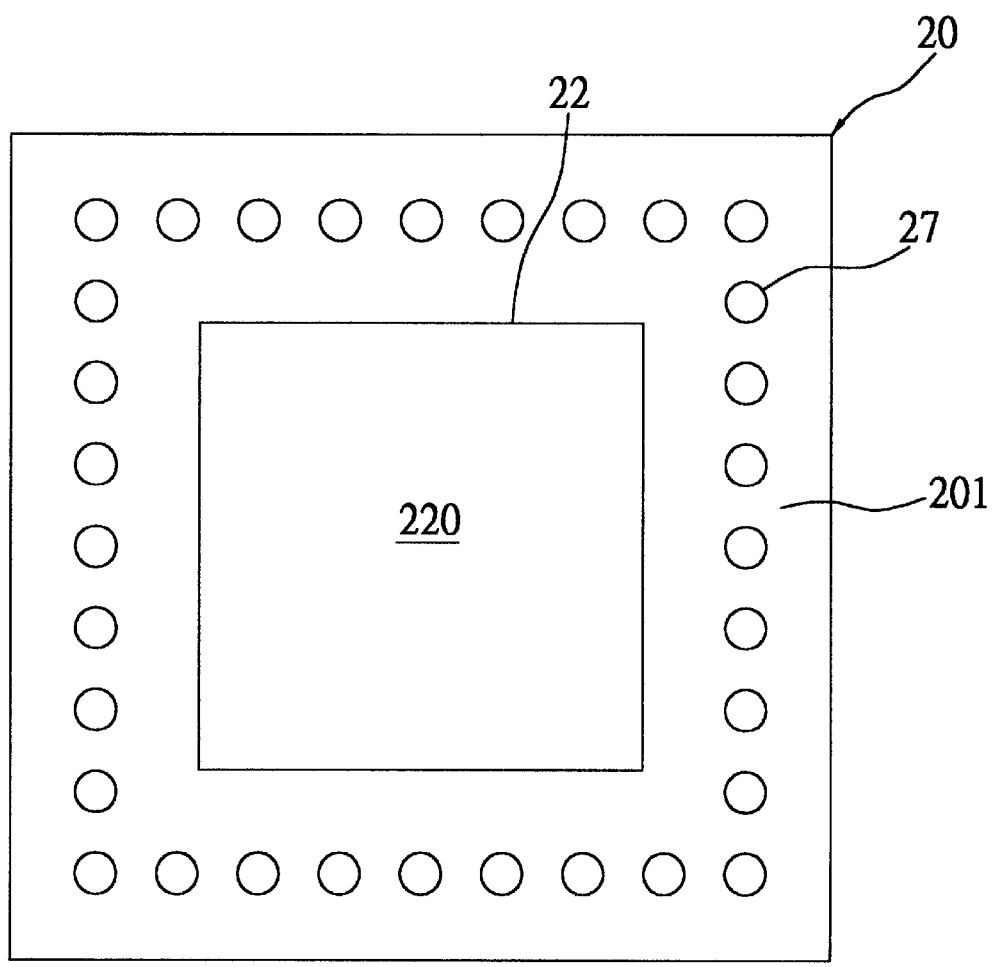
FIG. 2 is a bottom view of a first preferred embodiment of the semiconductor package of the invention.

Illustrated in FIGS. 1 and 2 are a sectional view and bottom view of a first preferred embodiment of the semiconductor package of the invention, respectively.

Referring to FIG. 1, the semiconductor package 2 of the first embodiment of the invention mainly comprises a substrate 20, a chip 21 mounted on the substrate 20, a thermal pad 22 formed on the substrate 20, and an encapsulant 23 for encapsulating the chip 21.

The substrate 20 has a top side 200 and an opposing bottom side 201. On the top side 200 there is predefined a die-attach region 202 at an approximately central position, wherein a plurality of first conductive traces 203 are formed outside the die-attach region 202 on the substrate 20, and a plurality of ground pads 204 are attached to the die-attach region 202. Moreover, within the die-attach region 202 there are formed a plurality of thermal vias 205 penetrating the substrate 20, wherein each of the thermal vias 205 has one end connected to one of the ground pads 204 on the top side 200 of the substrate 20 and the other end connected to the bottom side 201 of the substrate 20. On the bottom side 201 of the substrate 20 there are formed a plurality of second conductive traces 206 at positions corresponding to the first conductive traces 203, in a manner as to electrically connect the second conductive traces 206 to the first conductive traces 203 through a plurality of conductive vias 207 formed outside the die-attach region 202 and penetrating the substrate 20. Furthermore, on the top side 200 and the bottom side 201 of the substrate 20 there are respectively deposited solder mask 208, 209, so as to hermetically enclose the first conductive traces 203 and the second conductive traces 206, wherein the die-attach region 202 and bond fingers 203a at ends of the first conductive traces 203 are exposed to outside of the solder mask 208, and a position on the bottom side 201 corresponding to the die-attach region 202 and ball pads 206a at ends of the second conductive traces 206 are exposed to outside of the solder mask 209. As the substrate 20 is constructed by using a conventional technique, it is not further described in detail herein.

The chip 21 is attached to the die-attach region 202 on the substrate 20 by a conventional adhesive 24 such as silver paste. Alternatively, a plurality of chips can be mounted on the die-attach region 202, or a plurality of die-attach regions can be formed on the substrate 20, if necessary. After attaching the chip 21 to the substrate 20, a plurality of gold wires 25 are used to electrically connect the chip 21 to the bond fingers 203a of the first conductive traces 203, so as to establish electrical connection between the chip 21 and the substrate 20 through the gold wires 25.

The thermal pad 22 is simultaneously formed with the second conductive traces 206 by using a conventional technique such as etching a copper foil attached to the substrate 20. The thermal pad 22 is located right beneath the chip 21 at a position corresponding to the die-attach region 202. As the chip 21 and the thermal pad 22 are respectively connected to the ends of the thermal vias 205, heat generated by the chip 21 can be transmitted through the thermal vias 205 to the thermal pad 22. Further due to a surface 220 of the thermal pad 22 directly exposed to the atmosphere, the heat transmitted to the thermal pad 22 can be directly dissipated through the exposed surface 220 to the atmosphere, so that heat dissipating efficiency can be improved for the semiconductor package 2. Moreover, since the thermal pad 22 is made in a plate form, it provides larger area for heat dissipation than that of thermal balls used in the prior art, and allows the heat dissipating efficiency of the semiconductor package 2 to be more significantly improved. Furthermore, the thermal pad 22 is directly formed on the bottom side 201 of the substrate 20 without forming an opening at a substrate for disposing a heat sink therein as recited in the foregoing U.S. patent, so that increase in cost for fabricating the substrate 20 and problem of producing cracks between the substrate 20 and the thermal pad 22 can be avoided. In addition, after forming the thermal pad 22 on the substrate 20, the solder mask 209 can be applied in a manner as to encapsulate edge sides of the thermal pad 22, allowing the thermal pad 22 to be engaged with the solder mask 209, so as to enhance the attachment of the substrate 20 to the thermal pad 22. Alternatively, the thermal pad 22 can be separated from the solder mask 209 without being encapsulated by the solder mask 209.

Figure 3:
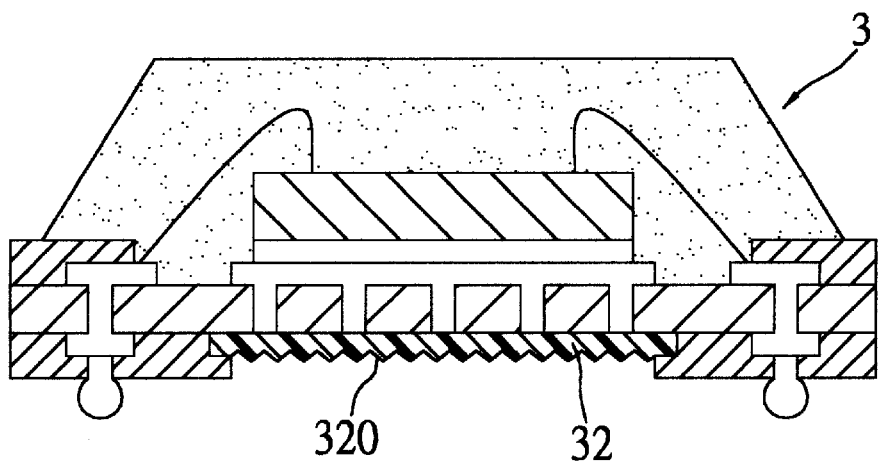
FIG. 3 is a sectional view of a second preferred embodiment of the semiconductor package of the invention.

After forming the encapsulant 23 on the top side 200 of the substrate 20, on the bottom side 201 of the substrate 20 there are implanted a plurality of solder balls 27 on the ball pads 206a of the second conductive traces 206 by using a conventional ball implantation technique, so as to allow the chip 21 to be electrically connected to an external device through the solder balls 27. As shown in FIG. 2, the solder balls 27 are disposed around the thermal pad 22 in a manner that the thermal pad 22 does not interfere with the solder balls 27. Further, as the thermal pad 22 has a thickness smaller than the height of the solder balls 27, this allows the solder balls 27 to be electrically connected to corresponding solder pads on a printed circuit board (not shown) without being interfered by the thermal pad 22 when bonding the semiconductor package 2 to the printed circuit board Second Preferred Embodiment Illustrated in FIG. 3 is a sectional view of the semiconductor package of a second preferred embodiment of the invention.

The semiconductor package 3 of the second embodiment is structurally identical to that of the first embodiment, with a difference in that a thermal pad 32 in the semiconductor package 3 has a surface 320 exposed to the atmosphere to be made uneven, so as to further increase area for heat dissipating provided by the thermal pad 32. The uneven surface 320 can be formed by any conventional technique with no particular limitation.

Third Preferred Embodiment

Figure 4:
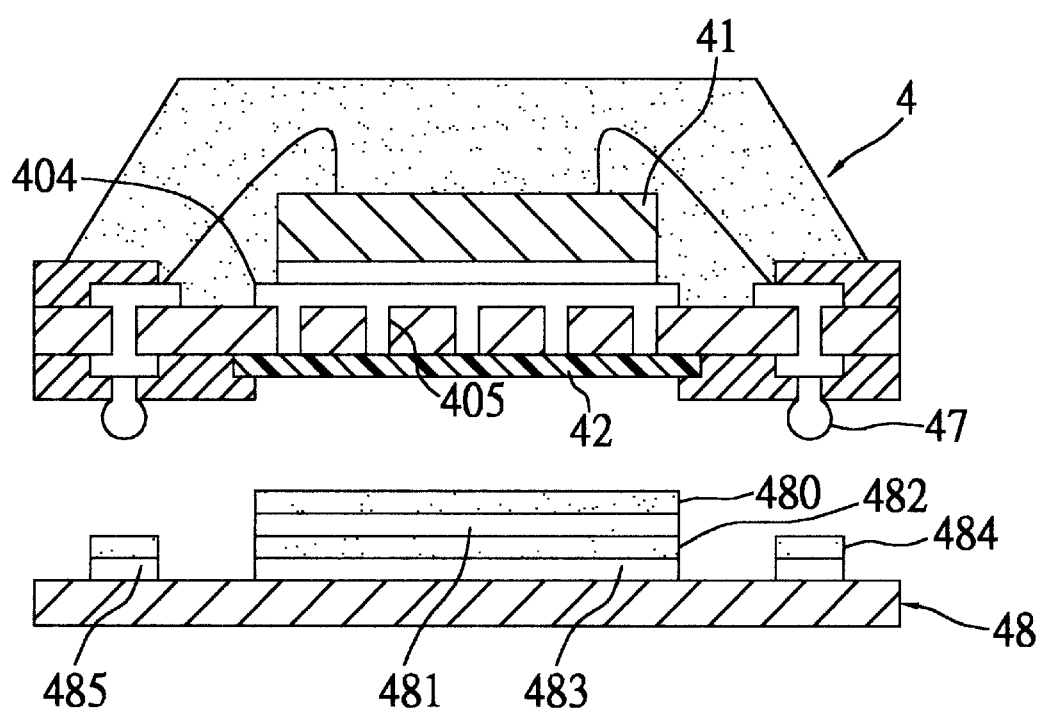
FIG. 4 is a sectional view of a third preferred embodiment of the semiconductor package of the invention.

Illustrated in FIG. 4 is a sectional view of the semiconductor package of a third preferred embodiment of the invention.

As shown in the drawing, the semiconductor package 4 of the third embodiment is structurally identical to that of the first embodiment, with a difference in that a thermal pad 42 used for dissipating heat generated by a chip 41 is attached by a conventional adhesive 480 such as solder paste to a heat sink 481 mounted on a printed circuit board 48, while a bottom side of the heat sink 481 is applied with solder paste 482 for attaching a ground pad 483 thereto. The attachment of the thermal pad 42 to the heat sink 481 provides larger area for heat dissipation for the chip 41, allowing heat dissipating efficiency to be improved. Moreover, the solder balls 47 are respectively electrically connected to solder pads 485 on the printed circuit board 48 by solder paste 484. Therefore, after electrically connecting the semiconductor package 4 to the printed circuit board 48, the heat generated by the chip 41 can be transmitted through a plurality of thermal vias 405 to the thermal pad 42 and the heat sink 481 to be dissipated to the printed circuit board 48. This not only significantly improves the heat dissipating efficiency, but also allows a ground circuit to be formed of ground traces 404, the thermal vias 405, the thermal pad 42, the heat sink 481 and the ground pad 483, so as to further improve electricity of the semiconductor package 4.

Fourth Preferred Embodiment

Figure 5:
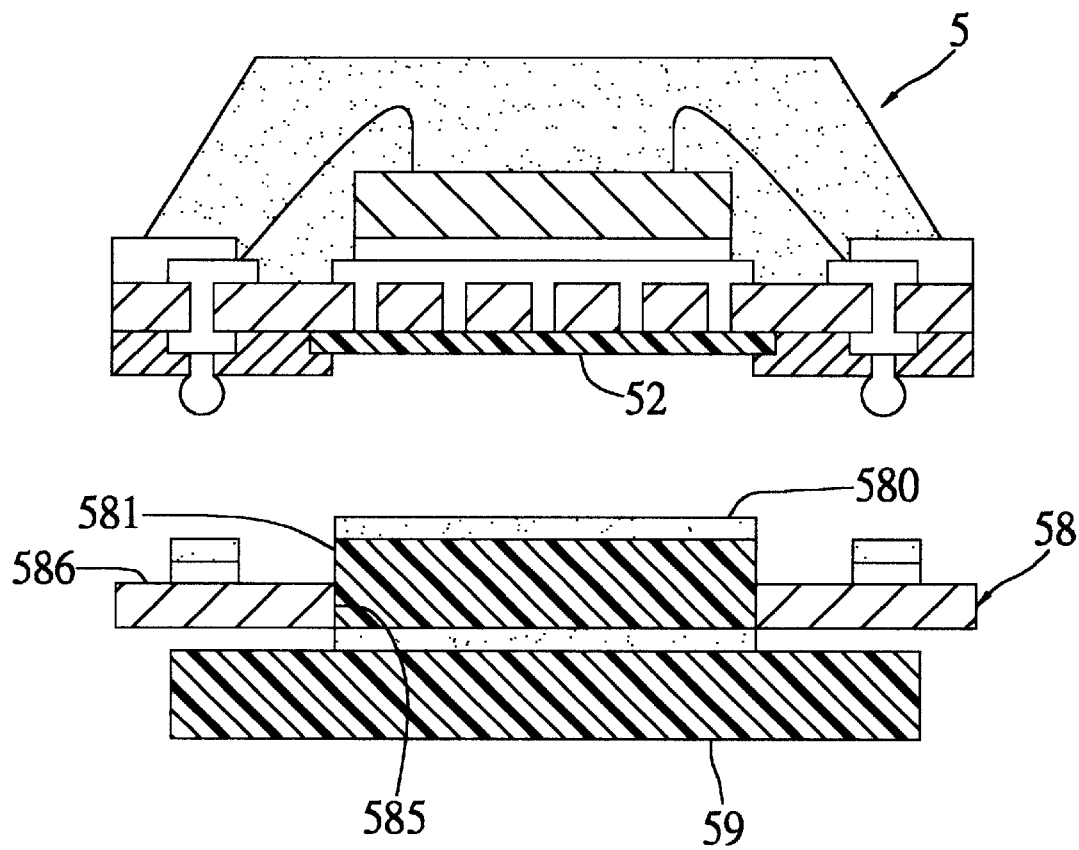
FIG. 5 is a sectional view of a fourth preferred embodiment of the semiconductor package of the invention.
Figure 6:
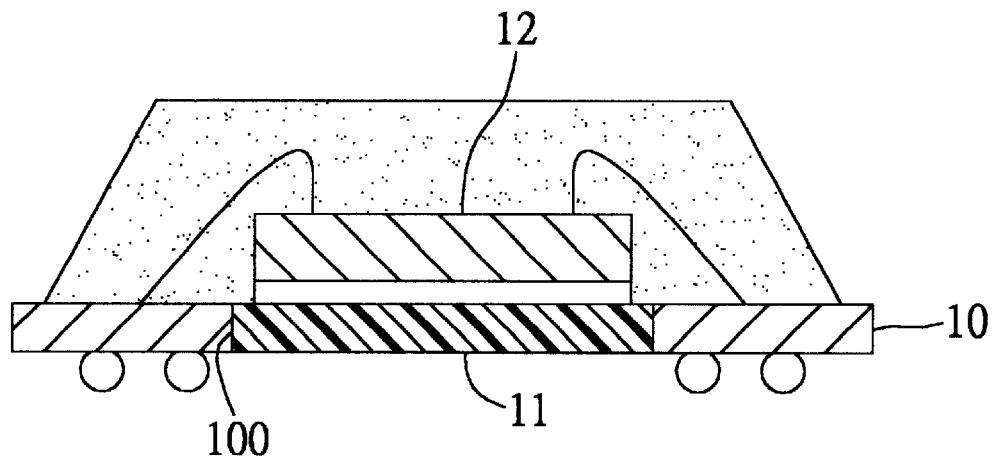
FIG. 6 (PRIOR ART) is sectional view of a conventional semiconductor package.

Illustrated in FIG. 5 is a sectional view of the semiconductor package of a fourth preferred embodiment of the invention.

As shown in the drawing, the semiconductor package 5 of the fourth embodiment is structurally identical to that of the third embodiment, with a difference in that a thermal pad 52 used for dissipating heat generated by a chip 51 is attached by solder paste 580 to a heat sink 581 embedded in a printed circuit board 58, which is electrically connected to the thermal pad 52 of the semiconductor package 5. The printed circuit board 58 is formed with an opening 585 for disposing the heat sink 581 therein. In order to successfully attach the thermal pad 52 to the heat sink 581 via the solder paste 580 for dissipating the heat generated by the chip 51, the heat sink 581 is needed to protrude from a top side 586 of the printed circuit board 58 by a certain height. Moreover, after attaching the semiconductor package 5 to the printed circuit board 58, a heat sink 59 can be externally connected to the thermal pad 52, so as to increase area for heat dissipating for further improving heat dissipating efficiency.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
   a substrate having a top side and an opposing bottom side, wherein a die-attach region is formed at a predetermined position on the top side for allowing at least one chip to be mounted on the die-attach region in a manner that the chip is electrically connected to the substrate, and a plurality of thermal vias are formed in the die-attach region in a manner as to penetrate the top side and the bottom side of the substrate;
   a thermal pad integrally formed on the bottom side of the substrate at a position corresponding to the chip and sized sufficiently to be connected to all of the thermal vias;
   a plurality of conductive elements implanted on the bottom side of the substrate free of interference with the thermal pad; and
   an encapsulant formed on the top side of the substrate for encapsulating the chip, with the thermal pad and the conductive elements on the bottom side of the substrate being exposed to outside of the encapsulant.

2. The semiconductor package of claim 1, wherein edge sides of the thermal pad are encapsulated by solder mask formed on the bottom side of the substrate.

3. The semiconductor package of claim 1, wherein the thermal pad is attached to a heat sink disposed on an external device electrically connected to the semiconductor package, so as to allow heat generated by the chip to be transmitted through the thermal vias to the thermal pad and then to the heat sink.

4. The semiconductor package of claim 3, wherein the external device is a printed circuit board.

5. The semiconductor package of claim 1, wherein the thermal pad is attached to a heat sink embedded an external device electrically connected to the semiconductor package, so as to allow heat generated by the chip to be transmitted through the thermal vias to the thermal pad and then to the heat sink.

6. The semiconductor package of claim 5, wherein the external device is a printed circuit board.

7. The semiconductor package of claim 1, wherein the thermal pad has a thickness smaller than height of the conductive elements.

8. The semiconductor package of claim 1, wherein the thermal pad has a surface to be made uneven for increasing area for heat dissipation.

9. The semiconductor package of claim 1, wherein the thermal pad is formed by a copper foil attached to the bottom side of the substrate.

10. The semiconductor package of claim 1, wherein the conductive elements are solder balls.

11. The semiconductor package of claim 1, wherein the chip is connected to the thermal vias for allowing heat generated by the chip to be transmitted through the thermal vias to the thermal pad.

* * * * *